TRANSISTORIZED BRIDGE AMPLIFIER WITH A BIAS COMPENSATING CIRCUIT THEREOF

Filed Feb. 1, 1962 2 Sheets-Sheet 1

INVENTORS
HARRY B. BROWN
CHARLES R. BANKS
BY
James H. Littlepage
ATTORNEY

Nov. 17, 1964 H. B. BROWN ETAL 3,157,839

TRANSISTORIZED BRIDGE AMPLIFIER WITH A BIAS COMPENSATING CIRCUIT THEREOF

Filed Feb. 1, 1962 2 Sheets-Sheet 2

INVENTORS
HARRY B. BROWN
CHARLES R. BANKS

BY James H. Littlepage
ATTORNEY

United States Patent Office 3,157,839
Patented Nov. 17, 1964

3,157,839

TRANSISTORIZED BRIDGE AMPLIFIER WITH A BIAS COMPENSATING CIRCUIT THEREFOR

Harry B. Brown, 524 S. Spring St., Falls Church, Va., and Charles R. Banks, 3487 S. Wakefield St., Arlington, Va.

Filed Feb. 1, 1962, Ser. No. 170,597
8 Claims. (Cl. 330—18)

This invention relates to bridge circuit amplifiers and, more particularly, to a feedback and control circuit in conjunction with a bridge amplifier for maintaining balanced currents and voltages in opposing sections thereof despite variations which exist or occur in the electrical characteristics of the components.

The invention, while utilizing solid-state amplifying and control devices, constitutes an improvement in the bridge amplifier art exemplified by the patent to Gubin, No. 2,235,677, wherein amplifying devices are used in each of four arms of a bridge with a source of power connected across one opposed pair of corners and a load connected across the other opposed pair of corners. By connecting the control electrodes of the amplifying devices with properly phased transformer windings, current is first caused to flow through the load in one direction and through one parallel pair of the bridge arms; and then through the load in the opposite direction and through the other parallel pair of bridge arms. Where, as in the Gubin patent, the amplifying devices are vacuum tubes, mismatches within normal tolerance ranges of the tubes and associated circuit components do not present serious hazards. However, where transistors and the like solid state or semi-conductor devices are used, even minor mismatches in components can result in quick breakdown and also intolerable distortion in the signal to the load. The object now is to provide a compensating circuit which will sense or pick off a signal which results from mismatch or dissimilarities in parameters of the transistors and associated components, and which will apply a compensating voltage to the control electrodes in such manner as to maintain apparent identity in operating characteristics of the transistors.

Figure 1:
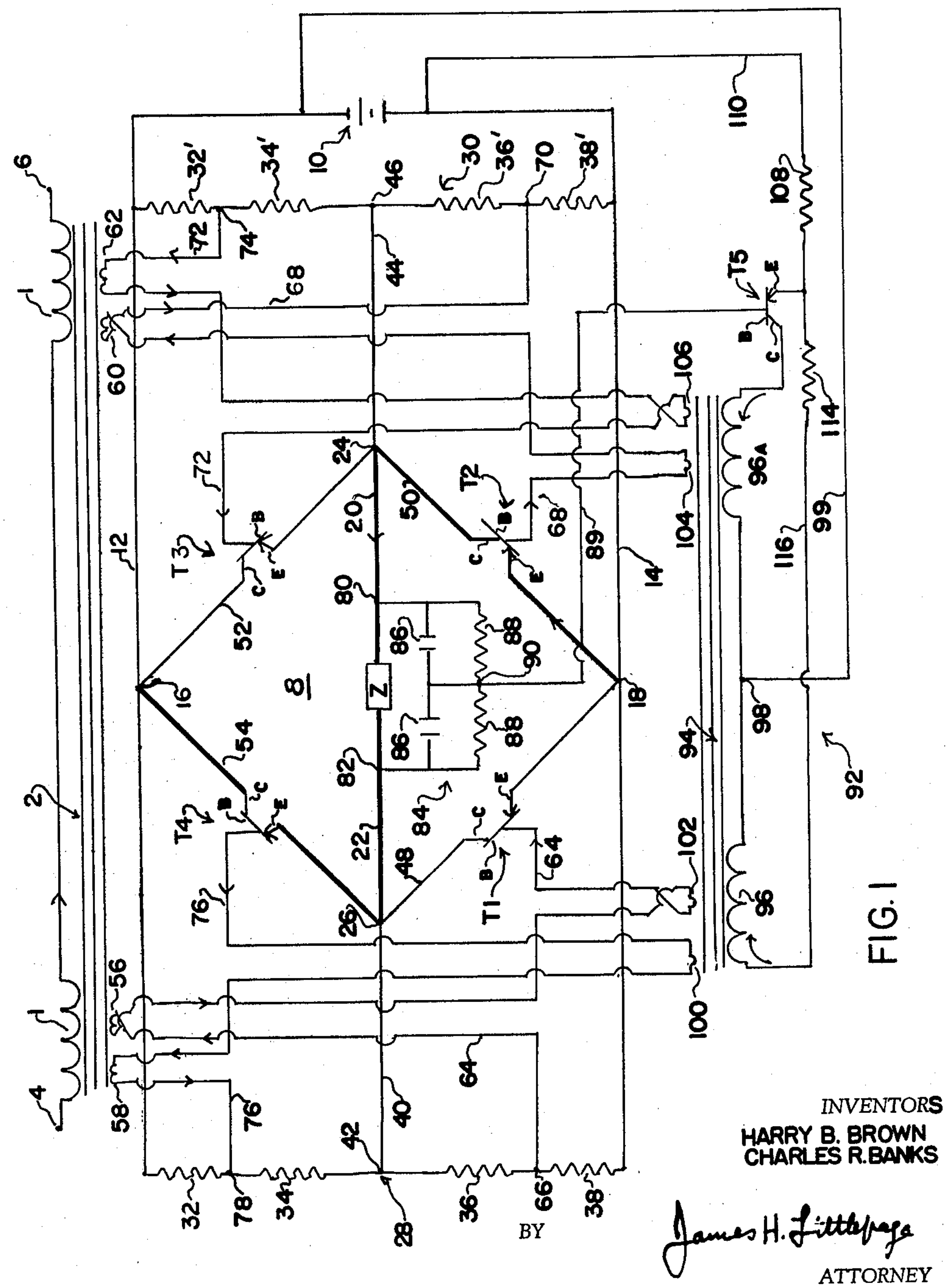
Figure 2:
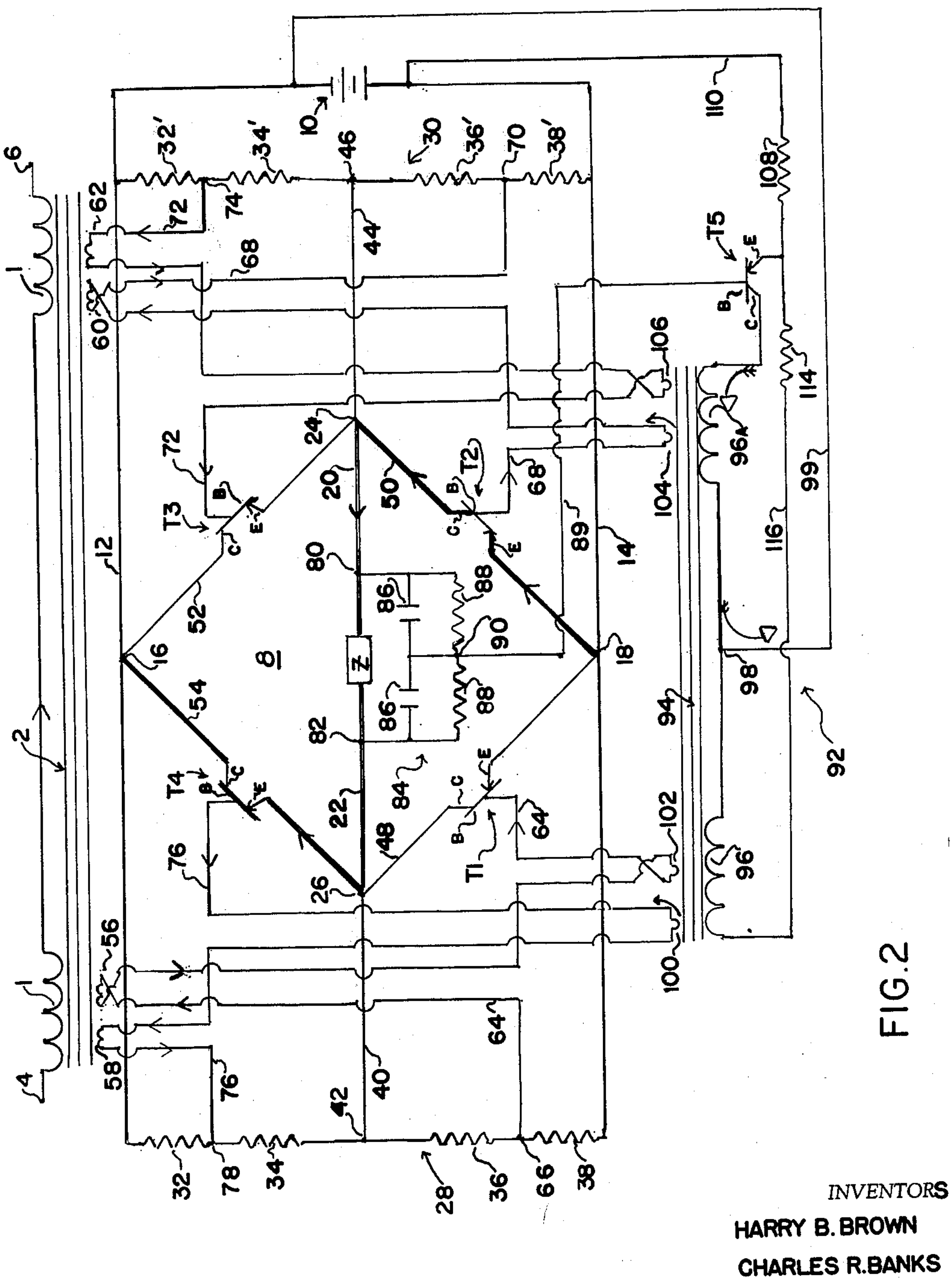

These and other objects will be apparent from the following specification and drawings, in which:

FIG. 1 is a circuit diagram illustrating a normal operating state of the amplifier; and, FIG. 2 is a circuit diagram illustrating response of the control circuit to an abnormality in a transistor in one arm of the bridge.

Referring now to the drawings, in which like reference numerals denote similar elements, the device disclosed by FIG. 1 and FIG. 2 is a high power audio amplifier having about 250 watts output power, working into a low impedance load Z, such as the voice coil of a loud speaker of about two ohms. An audio control signal is supplied to the primary winding 1 of an input transformer 2 via terminals 4 and 6 respectively connected to a suitable preamplifier, the power gain being effected by a bridge amplifier 8 supplied from a suitable source of direct current, for example, a 30 volt battery 10 whose terminals are connected via leads 12 and 14 to the opposite corners 16 and 18 of bridge 8. Load Z is connected by leads 20, 22 across the other opposite corners 24 and 26 of the bridge, and operating bias voltages for the bridge components are provided by voltage divider networks 28 and 30 connected across battery leads 12 and 14 on opposite sides of bridge 8. In the present example, it will be assumed that the voltage divider networks are each composed of two 820 ohm resistors 32, 32' and 36, 36', and two 10 ohm resistors 34, 34' and 38, 38'. A lead 40 connects the center tap 42 of divider network 28 with bridge corner 26, and a similar lead 44 connects center tap 46 of divider network 30 with bridge corner 24. In the respective bridge arms 48, 50, 52 and 54 are transistors T1, T2, T3, T4, each being, for example, type 2n1165 and each having an emitter *e*, collector *c* and base *b*. The input signal controls the amplifier as follows:

Input transformer 2 has four secondary windings 56, 58, 60 and 62. Base *b* of T1 is connected via lead 64 through secondary winding 56 to a tap 66 in divider network 28, and base *b* of T2 is similarly connected via lead 68 through secondary winding 60 to a corresponding tap 70 in divider network 30. In the upper arms of bridge 8, base *b* of T3 is connected via lead 72 through secondary winding 62 to divider network tap 74 and so likewise is base *b* of T4 connected via lead 76 to tap 78 of divider network 28. However, secondary winding 56 is reversed with respect to winding 58, and so also is winding 60 reversed with respect to winding 62. Let it be assumed that, during a positive half cycle of the signal input voltage, current flows through the primary winding 1 of input transformer winding 2 in the direction indicated by the arrow. The currents induced in secondary windings 56, 58, 60 and 62 will, therefore, be in the direction indicated by the arrows, with the result that bases *b* of T2 and T4 swing negative, thereby rendering T2 and T4 more conductive, and bases *b* of T1 and T3 go positive, thereby biasing T1 and T3 to cut-off. The main flow of current from battery lead 14 will then be from bridge corner 18 through arm 50, *e-c* of T2 to corner 24, lead 20 through load Z and thence through lead 22 to corner 26 and then through arm 54, and *e-c* of T4 to bridge corner 16, all as indicated by the heavy lines and arrows. During the negative phase of the control current through primary winding 1 of input transformer 2 the resultant current flowing in the circuit will reverse, and current will flow in the opposite direction through load Z, i.e., from bridge corner 26 to corner 24.

If it could be assumed that all the components were perfectly matched, and the operating parameters of the transistors, such as T2–T4, or T1–T3 which are alternately in series with load Z were initially the same and remained so through all load conditions and temperature ranges to which the amplifier is exposed, the voltage, as measured between point 80 and bridge corner 16 would swing from slightly less than +15 v. to approximately +20 v., and the voltage as measured between point 82 and bridge corner 16 would swing from slightly less than +15 v. to about +10 v. during each half cycle; and under those conditions, the impedance of the *e-c* circuit of T2 would be equal to that of T4. However, let it be assumed that T4 is faulty and the impedance of its *e-c* circuit becomes substantially less than that of T2. This sort of condition could cause T4 to "run away" with resultant burn-out. Even if relatively minor variations occurred in the operating characteristics, the voltage across the load could vary greatly, with resultant distortion of the signal. It is in these respects that the subject semi-conductor circuit differs in kind from the most nearly corresponding prior art vacuum tube circuit, and it is with these problems that the subject invention is concerned.

Connected at points 80, 82 on opposite sides of load Z is a sensing circuit 84, essentially an R-C filter network consisting of a pair of 0.05 mm. capacitors 86 and a pair of 6.8K resistors, the capacitors and resistors being connected back-to-back and having a common junction 90 which reflects the average between the voltages appearing at points 80, 82. Thus, in the normal example given, point 90 would vary insignificantly from slightly less than +15 v. with respect to bridge corner 16, which is connected directly to the negative side of battery 10.

Referring specifically to the lower portion of FIG. 1, there is shown a compensating network 92 consisting of a transformer 94 having a primary winding 96, 96*a* center tapped at 98 and four secondary windings 100, 102, 104 and 106 respectively. Secondary winding 100 is connected by lead 76 in series with secondary winding 58 of input transformer 2, between winding 58 and base *b* of T4; secondary winding 102 is connected in series with winding 56 between the latter and base *b* of T1; also connected in series between base *b* of T2 and winding 60, and between base *b* of T3 and winding 62 are the secondary windings 104 and 106 of transformer 94, it being noteworthy that windings 100 and 104 are disposed in the same sense with respect to one another, but in opposite sense with respect to windings 102 and 106.

Included in compensating network 92 is a transistor T5, for example, type 2n618 also having an emitter *e*, collector *c*, and a base *b* connected directly by lead 89 to junction 90 of sensing circuit 84. Emitter *e* of T5 is connected through a resistor 108 and lead 110 to the positive side of battery 10 and through resistor 114 and lead 116 to the free end of primary winding 96, the opposite free end of winding 96*a* being connected to collector *c* of T5. The center tap 98 of transformer 94 is connected by lead 99 to the negative side of battery 10, and the value of resistor 114, about twice the ohms as resistor 108, is selected to balance the impedance of the *e-c* circuit of T5, when the latter is in the FIG. 1 condition, with the following results: So long as junction 90 remains substantially at +15 v., base *b* of T5 is thereby biased to +15 v., the *e-c* current through T5 equals the current flow through resistor 114. There are thus established through primary winding 96, 96*a* of transformer 94 two equal and opposite current loops as indicated by the curved shaft arrows, with a net zero in the inductance of transformer 94. This is the condition illustrated in FIG. 1. However, let it be assumed that, at the start of a half cycle of the input signal, the impedance of the *e-c* circuit of T4 starts to drop more rapidly than that of T2. Under actual operating conditions short of complete failure of T4, the voltage conditions at points 80, 82 never should reach the extremes of the following example because of the constant over-riding compensation of circuit 92 but, for purposes of illustration, let it be assumed that T4 tends to conduct more readily and excessively than T2, and the voltage at point 80 remains at about +15 v. while point 82 drops to +10 v. Point 90 of sensing network 84 would thereby swing to +12½ v., thereby biasing base *b* of T5 more negative, from its normal +15 v. to +12 v., and thereby rendering T5 more conductive. As the voltage at base *b* of T5 starts to swing more negative, the current loop from *c*–T5 through the portion 96*a* to center tap 98 of the primary winding of transformer 94 predominates, and voltages are induced in secondary windings 100 and 104. Taking into account that T4 has started to conduct because the voltage at base *b* of T4 has started to swing negative from its normal bias as the result of the signal input voltage induced in secondary winding 58 of the input transformer, the voltage induced in secondary winding 100 bucks against the signal input voltage in lead 76 thereby rendering base *b* of T4 less negative than it would normally become as a result of the signal input. Simultaneously, the voltage induced in secondary winding 104, when the voltage at point 90 drops below normal is applied to base *b* of T2 in the same sense as the signal voltage induced in secondary winding 60 so that, because its base *b* is rendered more negative than it would ordinarily be as a result of the signal input, T2 becomes momentarily more conductive, thereby causing it to conduct to the same extent as T4. The voltages at points 80, 82 thus rise together until their average differential, as measured at point 90, is restored to +15 v. above bridge corner 16, whereupon the control network is restored to the equilibrium condition of FIG. 1.

At the same instant the bucking and aiding voltages are induced in windings 100, 104, similar bucking and aiding voltages are induced in windings 102, 106. However, because the secondary windings in input transformer 2 are so much larger than those in transformer 94, and transistors T1–T3 are then biased so far beyond cut off, the compensating effects of network 92 do not effect the base voltages of T1–T3 sufficiently to render them conductive in the half cycle during which current flows through the bridge arms 50 and 54 containing T2 and T4. During the other half cycle of the input signals, T1, T3 become the active ones, but the compensating modes for circuits 84, 92 remain the same.

If T2 tends to become more conductive than T4, then the voltage at point 80 will rise above normal, thereby rendering base *b* of T5 more positive and reducing its *e-c* current so that a predominating current loop prevails via lead 116 and through primary winding section 96 to center tap 98. The effect on secondary windings 100, 104 will then be in the opposite sense than that indicated by the curved-shaft arrows in FIG. 2 so that base *b* of T2 will be biased to reduce current flow through the *e-c* circuit of T2 while an abnormally negative bias is applied to base *b* of T4. In compensating circuit 92, T5 and resistor 114 function as a comparison device, the output of which varies in accordance with differences between the average potential sensed at junction 90 and a standard which in the example given, is the potential appearing across battery 10.

By applying the principles set forth in the above example, it will be apparent that circuits 84 and 92 apply corresponding correction for differences in the parameters of any of transistors T1, T2, T3 or T4, and for differences in their operation resulting from normal variations in the values of the resistors in voltage divides networks 28, 30 or in the windings of the transformers, while a maximum average voltage of about half that of battery 10 is applied across load Z. The desired average voltage across the load can be varied by means other than those required for the sensing and compensation circuits to which this invention is addressed.

The invention is not limited to the details disclosed and described herein, but is intended to cover all substitutions, modifications and equivalents within the scope of the following claims.

We claim:

1. In an amplifier including an electrical circuit in bridge configuration characterized by two pairs of opposed arms and two pairs of opposed corners, each of said arms including an amplifying device having input and output electrodes in series therewith and a control electrode for varying the conductivity between the input and output electrodes, means for connecting opposite sides of a source of electric potential across one of said opposed corner pairs, said circuit including means for connecting an impedance load across the other corner pair, and control circuit means for alternately applying control signals to the control electrodes of the amplifying devices in said opposed pairs of arms whereby to bias the devices in one opposed pair of arms in the sense to increase conductivity thereof with respect to the amplifying devices in the other opposed pair of arms, thereby applying said potential in alternating opposite senses across said load, the improvement which comprises: means for sensing the average potential appearing between points in said circuit means on opposite sides of said load; comparison means connected to said sensing means and having an output varying in accordance with differences between the sensed average potential and a standard potential, and means responsive to said comparison means for applying compensating biases to the control electrodes of the amplifying devices in said opposite arms in senses tending to maintain the average potential appearing between said points on opposite sides of said load in predetermined ratio with said standard potential.

2. The combination claimed in claim 1, wherein said amplifying devices comprising transistors, said input and output electrodes comprising emitter and collector elements, and said control electrodes comprising base elements.

3. The combination claimed in claim 2, said means for sensing said average potential comprising a pair of resistor-capacitor filter networks respectively connected to opposite sides of said load and having a common junction; said comparison means including a transistor having a base element connected to said common junction.

4. The combination claimed in claim 3, the last-named transistor having input and output electrodes, said means for applying compensating biases to said control electrodes comprising transformer means having a primary winding means with a mid-tap and having one end connected to one of the last named electrodes, means for connecting the other electrode with one side of said source of potential, means including an impedance connecting said other electrode with the other end of said primary winding means, means for connecting said mid-tap with the other side of said source of potential, said transformer means having four secondary windings respectively constituting series elements in the control means for applying compensating biases to the control electrodes of said amplifying devices.

5. In an amplifier including an electrical circuit in bridge configuration characterized by two pairs of opposed arms and two pairs of opposed corners, each of said arms including a transistor including input and output electrodes in series therewith and a control electrode for varying the conductivity between the input and output electrodes, means for applying an electric potential between one of said opposed corner pairs, said circuit including means for connecting an impedance load across the other corner pair, an input transformer having a primary winding with means for connecting the same to a source of control signal and four secondary windings, control circuit means for alternately applying control signals from the respective secondary windings to the control electrodes of the transistors in said opposed pairs of arms whereby to bias the transistors in one opposed pair of arms in the sense to increase conductivity between the input and output electrodes thereof with respect to the conductivity between the input and output electrodes of the transistors in the other opposed pair of arms, whereby to apply said potential in alternating opposite senses across said load; means for sensing the average potential appearing between points in said circuit means on opposite sides of said load; comparison means connected to said sensing means and having an output varying in accordance with differences between the sensed average maximum potential and a standard potential; and means responsive to said comparison means for applying compensating biases to the control electrodes of the transistors in said opposite arms in senses, with respect to the sense of said control signals, thereby maintaining the average potential appearing between said points on opposite sides of said load in predetermined ratio with said standard potential.

6. The combination claimed in claim 5, said means responsive to said comparison means comprising transformer means having primary winding means connected to said comparison means and four secondary winding means respectively connected in series between the secondary windings on said input transformer and the respective control electrodes to which the same is connected.

7. The combination claimed in claim 6, each secondary winding means to which one of said control electrodes is connected being in opposite direction with the secondary winding means to which the control electrodes in adjacent arms of the bridge are connected.

8. The combination claimed in claim 7, said comparison means including means for producing electromotive forces in first and second opposite directions in the primary winding means in response to deviations of the sensed average potential respectively above and below said standard potential.

References Cited by the Examiner

UNITED STATES PATENTS 2,235,677 3/41 Gubin ------------ 330—123 XR

ROY LAKE, *Primary Examiner.*

NATHAN KAUFMAN, *Examiner.*